United States Patent
Peng et al.

(10) Patent No.: US 9,887,126 B2
(45) Date of Patent: Feb. 6, 2018

(54) STRUCTURE OF DUAL DAMASCENE STRUCTURES HAVING VIA HOLE AND TRENCH

(71) Applicant: Taiwan Semiconductor Manufacturing Co., Ltd, Hsin-Chu (TW)

(72) Inventors: Tai-Yen Peng, Hsinchu (TW); Jyu-Horng Shieh, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/469,059

(22) Filed: Aug. 26, 2014

(65) Prior Publication Data
US 2016/0064274 A1    Mar. 3, 2016

(51) Int. Cl.
*H01L 21/768* (2006.01)
*H01L 21/311* (2006.01)

(52) U.S. Cl.
CPC .. *H01L 21/76813* (2013.01); *H01L 21/76808* (2013.01); *H01L 21/76811* (2013.01); *H01L 21/76816* (2013.01); *H01L 21/31144* (2013.01)

(58) Field of Classification Search
CPC ........... H01L 21/76807; H01L 45/1683; H01L 2221/1015; H01L 2221/1036; H01L 2224/05006; H01L 2224/05546
See application file for complete search history.

(56) References Cited

U.S. PATENT DOCUMENTS

| 8,633,108 | B1 | 1/2014 | Lee et al. | |
|---|---|---|---|---|
| 2003/0054629 | A1* | 3/2003 | Kawai | H01L 21/76804 438/622 |
| 2003/0067077 | A1* | 4/2003 | Lee | H01L 21/76834 257/758 |
| 2004/0157392 | A1* | 8/2004 | Hao | H01L 21/76807 438/253 |
| 2006/0188824 | A1 | 8/2006 | Chuang et al. | |
| 2006/0194430 | A1* | 8/2006 | Beck | H01L 21/76805 438/627 |
| 2009/0206489 | A1 | 8/2009 | Li et al. | |

(Continued)

FOREIGN PATENT DOCUMENTS

DE    10 2009 000 625 A1    10/2009
DE    10 2010 002 454 A1    9/2011

*Primary Examiner* — Michael Jung
*Assistant Examiner* — Mikka Liu
(74) *Attorney, Agent, or Firm* — Haynes and Boone, LLP

(57) ABSTRACT

A structure and a formation method of a semiconductor device structure are provided. The semiconductor device structure includes a semiconductor substrate and a conductive feature over the semiconductor substrate. The semiconductor device structure also includes a dielectric layer over the conductive feature and the semiconductor substrate and a via hole in the dielectric layer. The via hole has an oval cross section. The semiconductor device structure further includes a trench in the dielectric layer, and the via hole extends from a bottom portion of the trench. The trench has a trench width wider than a hole width of the via hole. In addition, the semiconductor device structure includes one or more conductive materials filling the via hole and the trench and electrically connected to the conductive feature.

20 Claims, 13 Drawing Sheets

(56) References Cited

U.S. PATENT DOCUMENTS

| | | | |
|---|---|---|---|
| 2009/0239375 A1* | 9/2009 | Riess | H01L 21/76808 |
| | | | 438/640 |
| 2010/0308469 A1 | 12/2010 | Tsai et al. | |
| 2011/0212616 A1 | 9/2011 | Seidel et al. | |
| 2012/0168957 A1* | 7/2012 | Srivastava | H01L 21/31144 |
| | | | 257/774 |
| 2012/0309189 A1 | 12/2012 | Park et al. | |
| 2012/0329269 A1 | 12/2012 | Arnold et al. | |
| 2014/0061918 A1 | 3/2014 | Jezewski et al. | |
| 2014/0127897 A1 | 5/2014 | Lee et al. | |

* cited by examiner

STRUCTURE OF DUAL DAMASCENE STRUCTURES HAVING VIA HOLE AND TRENCH

BACKGROUND

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

One method used by the industry to meet the demands for device density is the adoption of damascene and dual-damascene structures for interconnect structures. In a damascene process, an underlying insulating layer is patterned with open trenches. Afterwards, a conductor is deposited and polished to the level of the insulating layer to form a patterned conductor feature. Dual-damascene processes use a similar approach and form and fill two features (a trench and a via hole) with a single deposition of conductor.

However, as the feature sizes shrink further and density requirements increase, the pitch between features, such as interconnect structures, decreases. As a result, fabrication processes continue to become more difficult to perform. It is a challenge to form interconnect structures with shorter and shorter pitches in a semiconductor device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-2 to 1J-2 are top views of various stages of a process for forming a semiconductor device structure, in accordance with some embodiments.

FIG. 2 is a top view of a stage of a process for forming a semiconductor device structure, in accordance with some embodiments.

DETAILED DESCRIPTION

Figures 1, 1A:
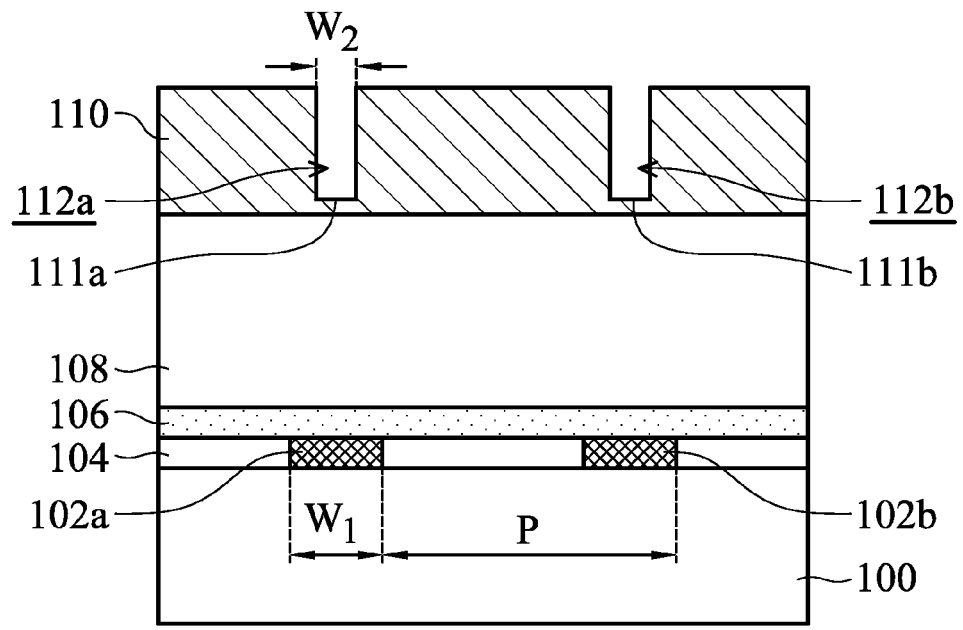
FIGS. 1A-1 to 1J-1 are cross-sectional views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1 to 1J-1 are cross-sectional views of various stages of a process for forming a semiconductor device structure, in accordance with some embodiments. FIGS. 1A-2 to 1J-2 are top views of various stages of a process for forming a semiconductor device structure, in accordance with some embodiments. In some embodiments, the cross-sectional views in FIGS. 1A-1 to 1J-1 are taken along the line I-I of the top views shown in FIGS. 1A-2 to 1J-2.

As shown in FIG. 1A-1, a semiconductor substrate 100 is provided. In some embodiments, the semiconductor substrate 100 is a bulk semiconductor substrate, such as a semiconductor wafer. For example, the semiconductor substrate 100 includes silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof. In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

In some embodiments, isolation features (not shown) are formed in the semiconductor substrate 100 to define and isolate various device elements (not shown) formed in the semiconductor substrate 100. The isolation features include, for example, trench isolation (STI) features or local oxidation of silicon (LOCOS) features.

Examples of the various device elements, that may be formed in the semiconductor substrate 100, include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

As shown in FIG. 1A-1, conductive features 102a and 102b are formed over the semiconductor substrate 100. In some embodiments, each of the conductive features 102a and 102b is a conductive line electrically connected to a corresponding device element. For example, conductive contacts (not shown) are used to form electrical connections between the device elements and the conductive features.

In some embodiments, the conductive features 102a and 102b are made of copper, aluminum, gold, titanium, cobalt, tungsten, another suitable conductive material, or a combination thereof. Each of the conductive features 102a and 102b has a line width $W_1$. In some embodiments, the line width $W_1$ is in a range from about 7 nm to about 20 nm. In some embodiments, the line width $W_1$ is a minimum line width of conductive lines in the semiconductor device structure. In some embodiments, a pitch P between the conductive features 102a and 102b is substantially two times of the line width $W_1$. The pitch P may be in a range from about 14 nm to about 40 nm.

In some other embodiments, each of the conductive features 102a and 102b includes one or more conductive lines and one or more conductive vias. FIG. 1A-1 is a simplified diagram of these cases. The width $W_1$ represents the line width of the widest conductive line of the conductive feature 102a or 102b.

In some embodiments, an insulating layer 104 is formed over the semiconductor substrate 100, as shown in FIG. 1A-1. In some embodiments, the insulating layer 104 is made of silicon oxide, borosilicate glass (BSG), phosphoric silicate glass (PSG), borophosphosilicate glass (BPSG), fluorinated silicate glass (FSG), porous dielectric material, another suitable low-k dielectric material, or a combination thereof. Various processes, including deposition, etching, planarization, or the like, may be used to form the conductive features 102a and 102b and the insulating layer 104.

As shown in FIG. 1A-1, an etch stop layer 106 is deposited over the insulating layer 104 and the conductive features 102a and 102b, in accordance with some embodiments. The etch stop layer 106 is used to protect the conductive features 102a and 102b from being damaged during subsequent processes for forming via holes and trenches. In some embodiments, the etch stop layer 106 is made of silicon carbide (SiC), silicon carbo-nitride (SiCN), silicon oxycarbide (SiCO), silicon nitride (SiN), silicon oxynitride (SiON), another suitable material, or a combination thereof. In some embodiments, the etch stop layer 106 is deposited using a chemical vapor deposition (CVD) process, a spin-on process, another applicable process, or a combination thereof. Embodiments of the disclosure have many variations. In some other embodiments, the etch stop layer 106 is not formed.

As shown in FIG. 1A-1, a dielectric layer 108 is deposited over the etch stop layer 106, in accordance with some embodiments. The dielectric layer 108 serves as an inter-metal dielectric (IMD) layer. In some embodiments, the dielectric layer 108 is made of a low-k dielectric material. The low-k dielectric material has a dielectric constant smaller than that of silicon dioxide. For example, the low-k dielectric material has a dielectric constant in a range from about 1.2 to about 3.5. As the density of semiconductor devices increases and the size of circuit elements becomes smaller, the resistance capacitance (RC) delay time increasingly dominates circuit performance. Using a low-k dielectric material as the dielectric layer 108 is helpful for reducing the RC delay.

In some embodiments, the dielectric layer 108 includes a spin-on inorganic dielectric, a spin-on organic dielectric, a porous dielectric material, an organic polymer, an organic silica glass, SiOF serious material, a hydrogen silsesquioxane (HSQ) series material, a methyl silsesquioxane (MSQ) series material, a porous organic series material, another suitable material, or a combination thereof. In some embodiments, the dielectric layer 108 includes a material including Si, C, O, or H. For example, the dielectric layer 108 includes $SiO_2$, SiOC, SiON, SiCOH, SiOCN, or a combination thereof. In some embodiments, the dielectric layer 108 is made of carbon-doped silicon oxide. The carbon-doped silicon oxide may also be referred to as organosilicate glass (OSG) or C-oxide. In some embodiments, the carbon-doped silicon oxide includes methyl silsesquioxane (MSQ), hydrogen silsesquioxane (HSQ), polysilsesquioxane, another suitable material, or a combination thereof. In some embodiments, the dielectric layer 108 includes fluorine-doped silicate glass (FSG) such as fluorine-doped —(O—Si(CH$_3$)$_2$—O)—. In some embodiments, the dielectric layer 108 is deposited using a CVD process, a spin-on process, a spray coating process, another applicable process, or a combination thereof.

Figures 1, 1A, 2:
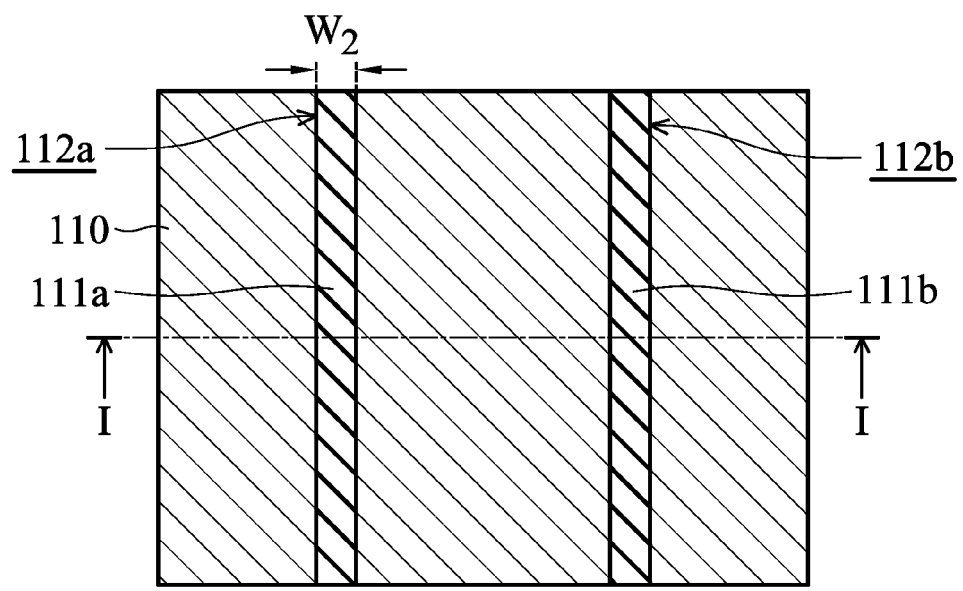

As shown in FIGS. 1A-1 and 1A-2, a hard mask 110 is formed over the dielectric layer 108, in accordance with some embodiments. The hard mask 110 is used to assist in subsequent etching processes. In some embodiments, the hard mask 110 is made of a metal-containing material. The metal-containing material may include titanium, titanium nitride, tantalum, tantalum nitride, tungsten, another suitable material, or a combination thereof. In some other embodiments, the hard mask 110 is made of silicon nitride, silicon oxynitride, polymeric carbon, graphitic carbon, silicon carbide, titanium oxide, silicon, another suitable material, or a combination thereof. In some embodiments, the hard mask 110 includes multiple stacked layers. The multiple stacked layers may be made of the same material. Alternatively, some of the stacked layers are made of different materials.

As shown in FIGS. 1A-1 and 1A-2, the hard mask 110 is patterned to have one or more trench openings such as trench openings 112a and 112b, in accordance with some embodiments. The trench openings 112a and 112b are used to assist in the formation of via holes and trenches in the dielectric layer 108 in subsequent processes. For example, the trench openings 112a and 112b are configured to define or determine positions and sizes of the via holes and the trenches. In some embodiments, the trench openings 112a and 112b extend towards the dielectric layer 108 without completely penetrating through the hard mask 110. The trench openings 112a and 112b have bottoms 111a and 111b, respectively. In FIG. 1A-2, the bottoms 111a and 111b are shown in bold lines for clarity. Because the trench openings 112a and 112b do not completely penetrate through the hard mask 110, the dielectric layer 108 can still be protected during subsequent processes. Moisture, chemical residues, or the like produced during the subsequent processes could be blocked from entering the dielectric layer 108. The quality of the dielectric layer 108 is maintained. However, it should be noted that embodiments of the disclosure are not limited to the above-mentioned embodiments. In some other embodiments, the trench openings 112a and 112b completely penetrate through the hard mask 110 to expose the dielectric layer 108.

In some embodiments, a hard mask layer is deposited over the dielectric layer 108, followed by being patterned to be the hard mask 110. A patterning process, including a photolithography process and an etching process, is used to form the trench openings 112a and 112b. In some other embodiments, the hard mask 110 is patterned using an electron beam writing process, an ion beam writing process, a mask-less photolithography process, a laser beam writing process, another applicable process, or a combination thereof.

As the feature size of the semiconductor device continues to decrease, lithography overlay control is getting harder and harder. For example, the line width $W_1$ of the conductive feature 102s or 102b is decreased to be in a range from about 7 nm to about 20 nm. As mentioned above, the trench openings 112a and 112b are configured to define or determine the position and sizes of the via holes. Therefore, the alignment between the trench openings and the underlying conductive features also determines the alignment between the via holes and the conductive features. The alignment would affect electrical qualities of the subsequently formed interconnect structures. If there is a serious misalignment between the trench opening and the conductive feature, the subsequently formed via hole is also negatively affected.

As shown in FIGS. 1A-1 and 1A-2, each of the trench openings 112a and 112b has a width $W_2$. In order to ensure an appropriate alignment between the trench opening and the conductive feature, the width $W_2$ is set to be smaller than the line width $W_1$, in accordance with some embodiments. Each of the trench opening 112a and 112b is positioned right above the corresponding conductive feature 102a or 102b. In other words, an imaginary projection of the trench opening on the corresponding conductive feature is positioned between opposite edges of the conductive feature. The imaginary projection does not extend across edges of the conductive feature.

In some embodiments, the width $W_2$ is in a range from about 5 nm to about 18 nm. In some embodiments, the ratio of the widths $W_2$ to $W_1$ ($W_2/W_1$) is in a range from about 0.5 to about 0.8. Each of the trench openings 112a and 112b could be aligned with the conductive feature 102a or 102b more easily since the conductive feature is a relatively wide target for the trench opening to aim at.

Even if a misalignment or shifting still occurs during the patterning process for forming the trench openings 112a and 112b, the relatively wide conductive feature enables the patterning process of the trench openings to have a larger overlay margin. Each of the trench openings 112a and 112b may still be positioned right above the corresponding conductive feature.

In some cases, if the width ratio ($W_2/W_1$) is higher than about 0.8, the width $W_2$ might be too large, such that the alignment between the trench opening and the conductive feature is not easy to achieve. In some other cases, if the width ratio ($W_2/W_1$) is smaller than about 0.5, the width $W_2$ might be too small, such that the subsequently formed via hole in the dielectric layer 108 has a corresponding small width. As a result, the contact area between the conductive feature (such as the conductive feature 102a) and a conductive via which will be formed in the via hole might not be sufficient. A high resistance is therefore formed between the conductive via and the conductive feature.

However, it should be appreciated that the width ratio ($W_2/W_1$) is not limited to a range from about 0.5 to about 0.8. The width ratio ($W_2/W_1$) may be in a different range in some other cases. For example, the width ratio ($W_2/W_1$) is in a range from about 0.4 to about 0.9.

Figures 1, 1B:
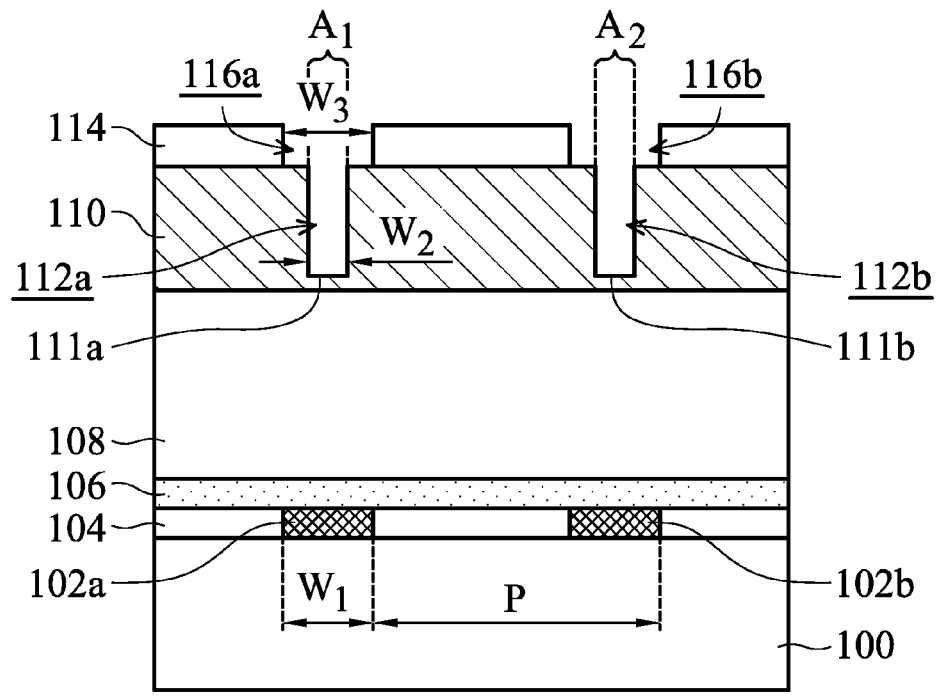
Figures 1, 1B, 2:
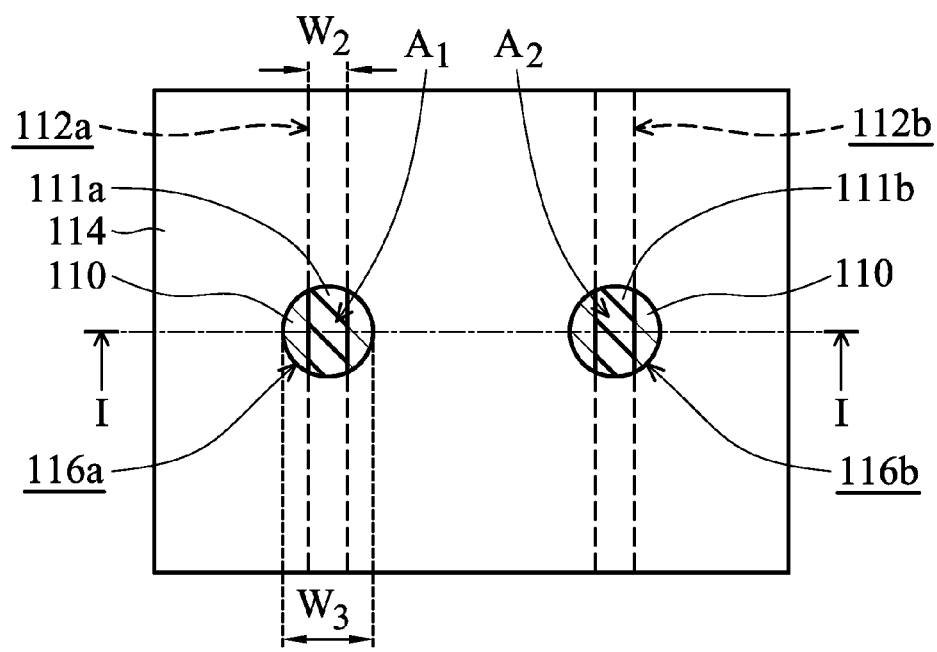

Afterwards, a mask layer 114 is deposited over the hard mask 110, as shown in FIGS. 1B-1 and 1B-2 in accordance with some embodiments. The mask layer 114 fills the trench openings 112a and 112b, and is then partially removed using a patterning process to form hole openings including hole openings 116a and 116b. In some embodiments, the mask layer 114 is made of a photoresist material or the like. The hole openings 116a and 116b expose a portion of the hard mask 110 and portions of the trench openings 112a and 112b. The bottoms 111a and 111b of the trench openings 112a and 112b not covered by the mask layer 114 are also exposed by the hole openings 116a and 116b, as shown in FIGS. 1B-1 and 1B-2. The hole openings 116a and 116b together with the expose trench openings 112a and 112b are used to assist in the formation of the via holes in the dielectric layer 108.

As shown in FIGS. 1B-1 and 1B-2, each of the hole openings 116a and 116b has a width $W_3$. In some embodiments, the width $W_3$ is set to be greater than the width $W_2$ of the trench opening 112a or 112b. Therefore, it is ensured that the hole openings 116a and 116b extend across the trench openings 112a and 112b, respectively. As shown in FIGS. 1B-1 and 1B-2, an overlapping portion $A_1$ between the hole opening 116a and the trench opening 112a is formed. Similarly, an overlapping portion $A_2$ between the hole opening 116b and the trench opening 112b is also formed.

The overlapping portions $A_1$ and $A_2$ together form a via hole pattern which will be substantially transferred to the dielectric layer 108 to form the via holes. Because the hole opening 116a extends across the trench opening 112a, the overlapping portion $A_1$ has a width that is the same as the width $W_2$ of the trench opening 112a. Similarly, the hole opening 116b also extends across the trench opening 112b. The overlapping portion $A_2$ between the hole opening 116b and the trench opening 112b has a width substantially equal to the width $W_2$. Each of the overlapping portions $A_1$ and $A_2$, which have substantially the same width, corresponds to a via hole which will be formed in the dielectric layer 108.

In some embodiments, the width $W_3$ is in a range from about 8 nm to about 45 nm. In some embodiments, the ratio of the widths $W_3$ to $W_2$ ($W_3/W_2$) is in a range from about 1.2 to about 3.5. In some cases, if the width ratio ($W_3/W_2$) is smaller than about 1.2, the width $W_3$ of the hole opening 116a might be too small, which leads to a small overlay margin. If a misalignment occurs, some of the hole openings might not be able to extend across the corresponding trench openings. As a result, some of the overlapping portions may have a width smaller than the width $W_2$. The via holes formed accordingly would have various widths, which negatively affects the product quality.

In some other cases, if the width ratio ($W_3/W_2$) is higher than about 3.5, the width $W_3$ might be too large, such that too much area of the hard mask 110 is exposed. The greater the area of the hard mask 110 that is exposed, the greater the likelihood that the exposed hard mask 110 will be damaged during a subsequent via hole etching process. The hard mask 110 exposed by the hole opening 116a or 116b may be damaged or removed to expose the dielectric layer 108 and can no longer protect the underlying dielectric layer 108. As a result, a via hole having an undesired width may be formed.

However, it should be appreciated that the width ratio ($W_3/W_2$) is not limited to a range from about 1.2 to about 3.5. The width ratio ($W_3/W_2$) may be in a different range in some other cases. For example, the width ratio ($W_3/W_2$) is in a range from about 2 to about 5.

In some embodiments, each of the hole openings 116a and 116b has a substantially circular top-view shape, as shown in FIG. 1B-2. In other words, when observing the hole openings 116a and 116b at a position right above the structure shown in FIG. 1B-1, the peripheries of the hole openings 116a and 116b are substantially circular. In other words, each of the hole openings 116a and 116b has a substantially circular cross section which is taken along a plane parallel to the main surface of the semiconductor substrate 100. However, embodiments of the disclosure are not limited thereto. The top view or the cross section of the hole openings may have a different shape, such as a square shape, an oval shape, a rectangular shape, a triangular shape, a quadrilateral shape, or another suitable shape.

Figures 1, 1C:
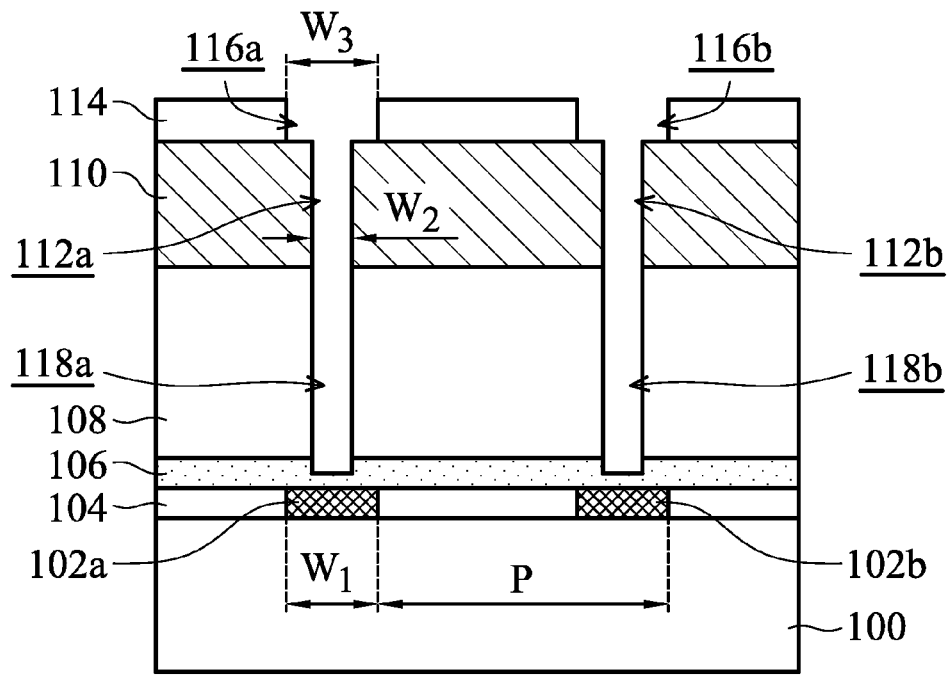
Figures 1, 1C, 2:
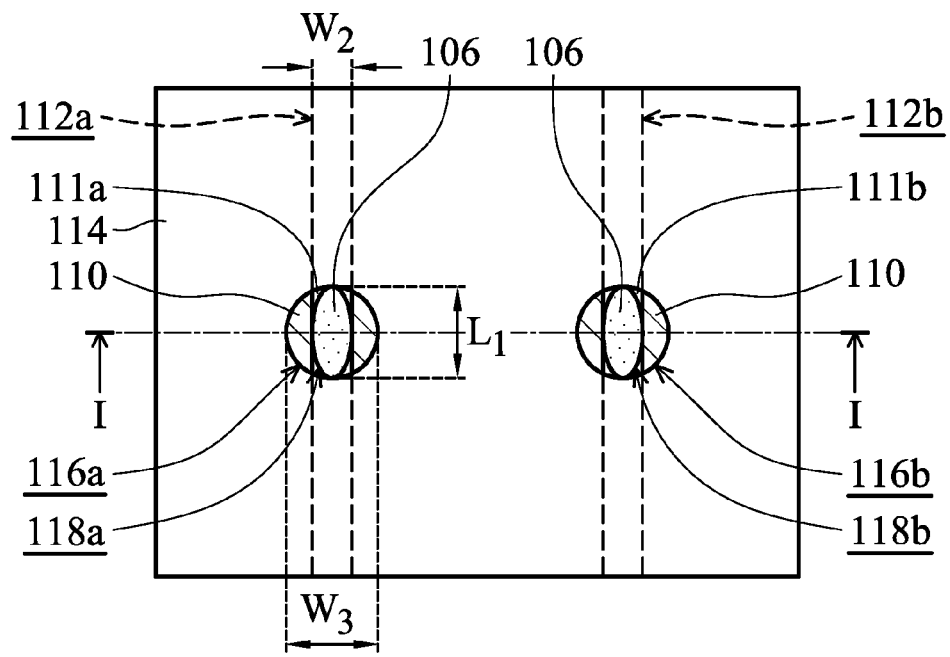

As shown in FIGS. 1C-1 and 1C-2, the dielectric layer 108 is partially removed to form via holes 118a and 118b, in accordance with some embodiments. Through the overlapped portions of the hole openings 116a and 116b and the trench openings 112a and 112b, the hard mask 110 is etched such that the portion of the hard mask 110 under the overlapped portions is removed to expose the dielectric layer 108. Afterwards, another etchant is used in a via hole etching process to etch the dielectric layer 108. As a result, the via holes 118a and 118b are formed. During the via hole etching process, the remaining hard mask 110 protects the dielectric layer 108 from being etched. In some embodiments, both the via holes 118a and 118b extend into the etch stop layer 106, as shown in FIGS. 1C-1 and 1C-2.

As mentioned above, the overlapping portions $A_1$ and $A_2$ (see FIGS. 1B-2) between the hole opening and the trench opening together form the via hole pattern. The via hole pattern is transferred to the dielectric layer 108 to form the via holes 118a and 118b after the via hole etching process. The position and the size of the via hole 118a are together determined or defined by the patterns of the trench opening 112a and the hole opening 116a. Therefore, each of the via holes 118a and 118b has substantially the same width which is substantially equal to the width $W_2$ of the trench opening 112a or 112b.

As mentioned above, the trench openings 112a and 112b are aligned with the respective conductive features 102a and 102b. Therefore, the via holes 118a and 118b formed accordingly are also aligned with the conductive features 102a and 102b, respectively. Both the size and the position of the via holes 118a and 118b can be controlled. In some embodiments, the sizes and the profiles of the via holes 118a and 118b are substantially the same.

Due to a corner rounding effect, the via hole 118a formed in the dielectric layer 108 may not have exactly the same top-view shape or exactly the same cross section as the overlapping portion $A_1$. In some embodiments, the via hole 118a has a substantially elliptical or oval top-view shape, as shown in FIG. 1C-2. The via hole 118a has a substantially oval cross section taken along a plane parallel to the main surface of the semiconductor substrate 100. Similarly, the via hole 118b also has a substantially elliptical or oval top-view shape, as shown in FIG. 1C-2 in accordance with some embodiments. The via hole 118b also has a substantially oval cross section taken along a plane parallel to the main surface of the semiconductor substrate 100.

In some embodiments, each of the via holes 118a and 118b includes a long axis and a short axis oriented perpendicular to the long axis, as shown in FIG. 1C-2. The long axis has a long axis length $L_1$, and the short axis has a short axis length which is substantially equal to the width $W_2$ of the trench opening 112a. In some embodiments, the long axis length $L_1$ is substantially equal to the width $W_3$ of the hole opening 116a that has a circular shape from the top view. In some embodiments, the ratio of the long axis length to the short axis length is substantially equal to the width ratio ($W_3/W_2$). For example, the ratio of the long axis length to the short axis length is in a range from about 1.2 to about 3.5.

In some embodiments, the via holes 118a and 118b are simultaneously formed in the same process. However, embodiments of the disclosure are not limited to the embodiments mentioned above. In some other embodiments, a double patterning process is used to form the via holes 118a and 118b. In these cases, the via holes 118a and 118b are sequentially formed in different processes.

Embodiments of the disclosure have many advantages. For example, the margin of the patterning process of the mask layer 114 is enlarged. FIG. 2 is a top view of a stage of a process for forming a semiconductor device structure, in accordance with some embodiments. As mentioned above, the mask layer 114 is patterned to form the hole openings 116a and 116b using a photolithography process in some embodiments. Due to the dimension shrinkage, a misalignment or shifting of the hole openings 116a and 116b might occur in some cases. As shown in FIG. 2, in some embodiments, a hole opening 116b' is shifted when compared with the hole opening 116b shown in FIG. 1C-2.

In some embodiments, even if a misalignment or shifting occurs, the shape and size of the overlapping portion between the trench opening 112b and the hole opening 116b' is still substantially the same. Therefore, a via hole 118b' formed accordingly still have substantially the same size and the same shape as those of the via hole 118a or the via hole 118b shown in FIG. 1C-2. Because the alignment between the trench opening 112b and the conductive feature (not shown) has been achieved, the via hole 118b' is also aligned with the conductive feature.

As shown in FIG. 2, the via hole 118b' also has a substantially oval top-view shape or a substantially oval cross section taken along a plane parallel to the main surface of the semiconductor substrate 100, in accordance with some embodiments. The via hole 118b' also includes a long axis and a short axis oriented perpendicular to the long axis, as shown in FIG. 2. The long axis has a long axis length $L_2$, and the short axis has a shot axis length which is substantially equal to the width $W_2$ of the trench opening 112b. In some embodiments, the long axis length $L_2$ is substantially equal to the width $W_3$. In some embodiments, the ratio of the long axis length to the short axis length is in a range from about 1.2 to about 3.5. The shapes and sizes of the via holes 118a and 118b' are substantially the same. Conductive vias which will be formed in the via holes 118a and 118b' could exhibit substantially the same electrical quality.

As shown in FIG. 1C-1, the sidewall of the via hole 118a is substantially vertical to the top surface of the dielectric layer 108, in accordance with some embodiments. However, embodiments of the disclosure have many variations and are not limited to the embodiments shown in FIG. 1C-1. In some other embodiments, the via hole 118a has a slanted sidewall. In some embodiments, widths of the via hole 118a gradually decrease along a direction from the top of the via hole 118a to the bottom of the via hole 118a.

Embodiments of the disclosure have many variations. For example, the top view shape or the cross section of the via hole is not limited to being substantially oval. In some embodiments, the via hole has a substantially circular top-view shape or a substantially circular cross section taken along a plane parallel to the main surface of the semiconductor substrate. Through tuning the sizes and shapes of the hole opening and the trench opening, the size and shape of the via hole may be varied according to requirements.

Figure 3:
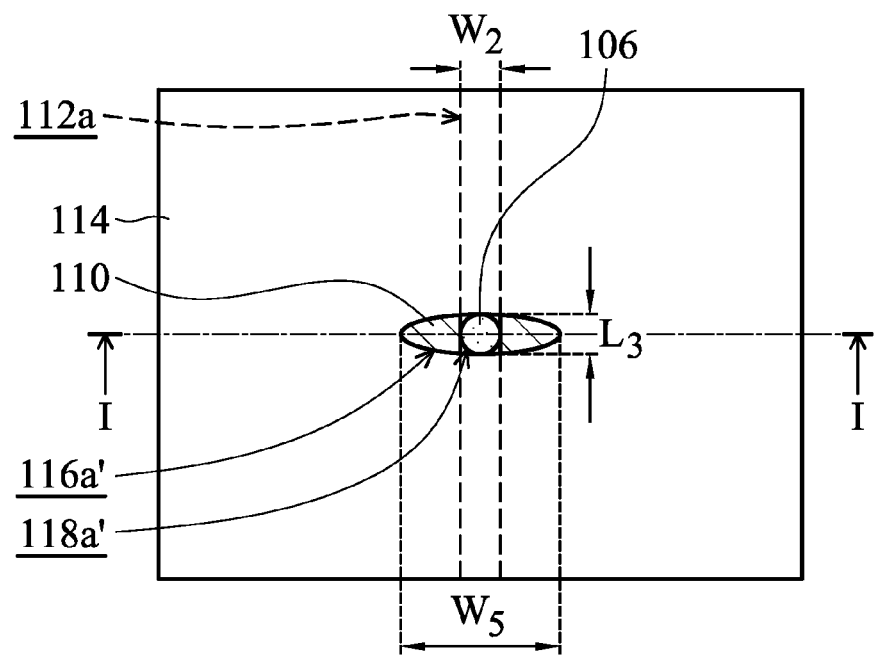
FIG. 3 is a top view of a stage of a process for forming a semiconductor device structure, in accordance with some embodiments.

FIG. 3 is a top view of a stage of a process for forming a semiconductor device structure, in accordance with some embodiments. In some embodiments, the mask layer 114 has a hole opening 116a' which has a substantially oval top-view shape or a substantially oval cross section taken along a plane parallel to the main surface of the semiconductor substrate 100. The hole opening 116a' includes a long axis and a short axis oriented perpendicular to the main axis, as shown in FIG. 3. The long axis has a long axis length $W_5$. The long axis length $W_5$ is set to be greater than the width $W_2$ of the trench opening 112a to ensure that the hole opening 116a' extends across the trench opening 112a.

The short axis has a short axis length $L_3$. In some embodiments, the short axis length $L_3$ is substantially equal to the width $W_2$ of the trench opening 112a. An overlapping portion between the trench opening 112a and the hole opening 116a' is formed. After the dielectric layer 108 is etched through the trench opening 112a and the hole opening 116a', the pattern of the overlapping portion is substantially transferred to the dielectric layer 108 to form a via hole 118a'. The via hole 118a' has a substantially circular shape from the top view or a substantially oval cross section taken along a plane parallel to the main surface of the semiconductor substrate 100, as shown in FIG. 3 in accordance with some embodiments.

By tuning the shape or size of the hole opening 116a', the shape or size of the via hole 118a' can be varied according to requirements. In some embodiments, the short axis length $L_3$ is greater than the width $W_2$ of the trench opening 112a. In these cases, the via hole 118a' has a substantially oval top-view shape or a substantially oval cross section taken along a plane parallel to the main surface of the semiconductor substrate. In some other embodiments, the short axis length $L_3$ is smaller than the width $W_2$ of the trench opening 112a. In these cases, the via hole 118a' has a substantially oval top-view shape or a substantially oval cross section taken along a plane parallel to the main surface of the semiconductor substrate.

Figures 1, 1D:
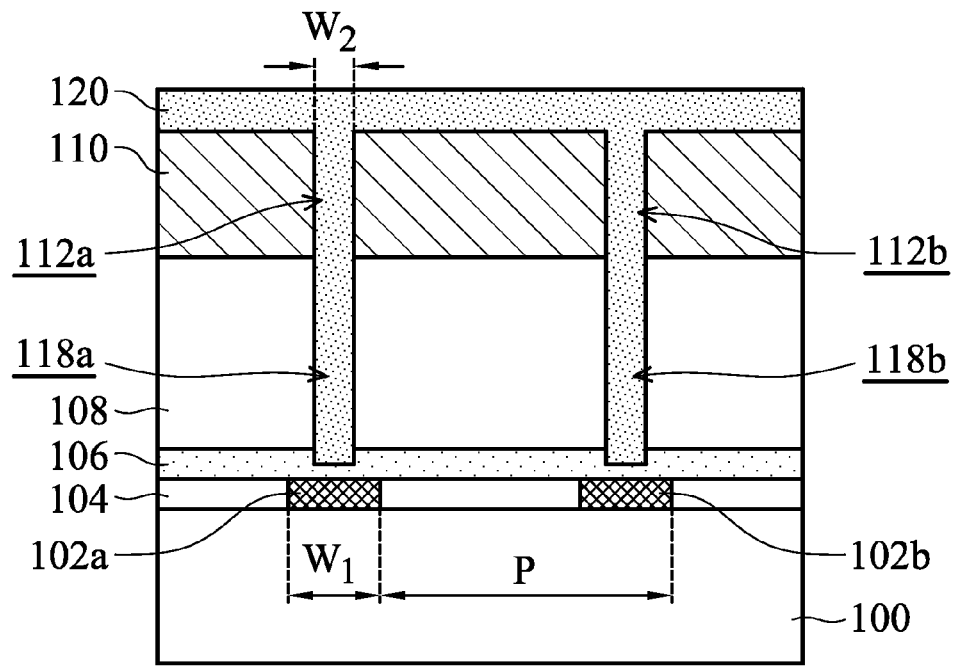
Figures 1, 1D, 2:
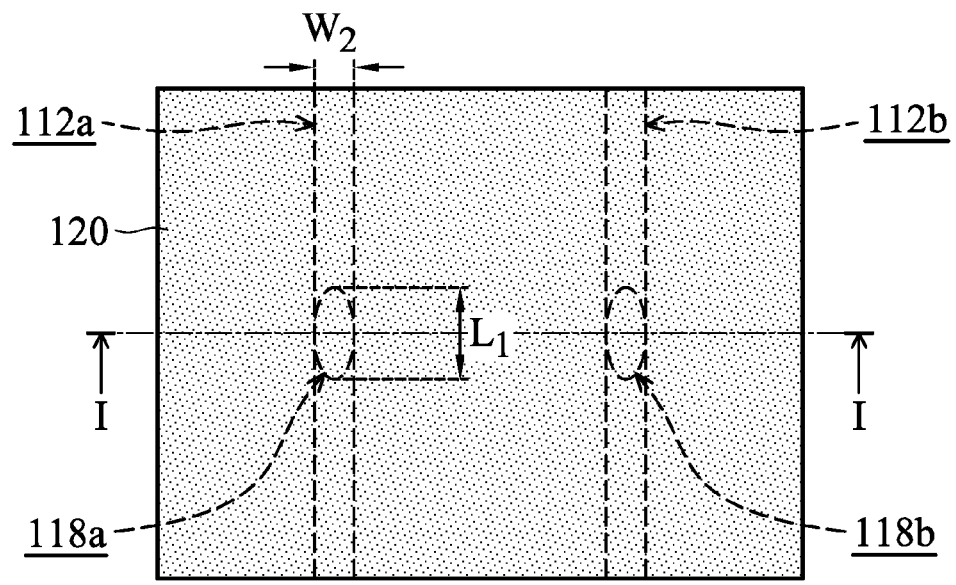

As shown in FIG. 1D-1, the mask layer 114 is removed, and a protective layer 120 is deposited over the hard mask 110, in accordance with some embodiments. In some embodiments, the mask layer 114 is removed using an ashing process, a striping process, or another applicable process. The protective layer 120 fills the via holes 118a and 118b and the trench openings 112a and 112b. The protective layer 120 is used to protect the via holes 118a and 118b during a subsequent trench etching process. In some embodiments, the protective layer 120 is made of a photoresist material or another suitable material. In some embodiments, the protective layer 120 is deposited using a spin-on process, a CVD process, an atomic layer deposition (ALD) process, another applicable process, or a combination thereof.

Figures 1, 1E:
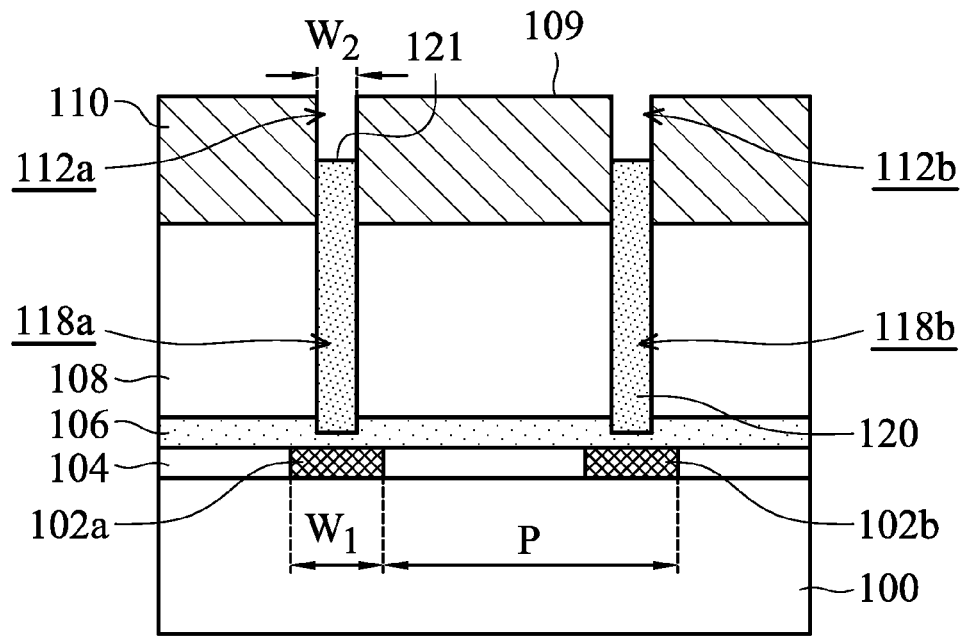
Figures 1, 1E, 2:
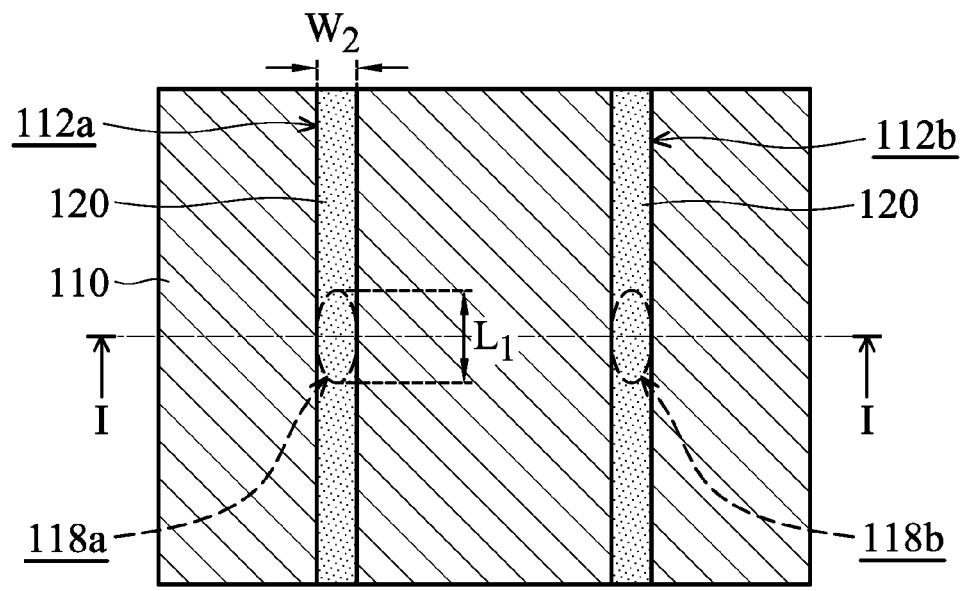

As shown in FIGS. 1E-1 and 1E-2, the protective layer 120 is etched back, in accordance with some embodiments. In some embodiments, a dry etching process is used to etch back the protective layer 120. For example, an oxygen-containing plasma is used to etch back the protective layer 120. The protective layer 120 outside of the trench openings 112a and 112b and an upper portion of the protective layer 120 within the trench openings 112a and 1120b are removed. As shown in FIG. 1E-1, after the etching back process, a top surface 121 of the protective layer 121 is below a surface 109 of the hard mask 110.

In some embodiments, the protective layer 120 is etched back in a process chamber in which the pressure is in a range from about 1.5 mTorr to about 300 mTorr. In some embodiments, a gas or a mixture of gas is used for forming a suitable etchant. The gas or mixture of gas may include $O_2$, $N_2$, $H_2$, $CF_4$, $CHF_3$, $CH_2F_2$, $CH_3F$, $Cl_2$, another suitable gas, or a combination thereof. In some embodiments, a top source voltage and a bias voltage are used to assist in the etching back process. The top source voltage may be in a range from about 150V to about 1500V. The bias voltage may be in a range from about 5V to about 1000V. In some other embodiments, the bias voltage is not applied.

Figures 1, 1F:
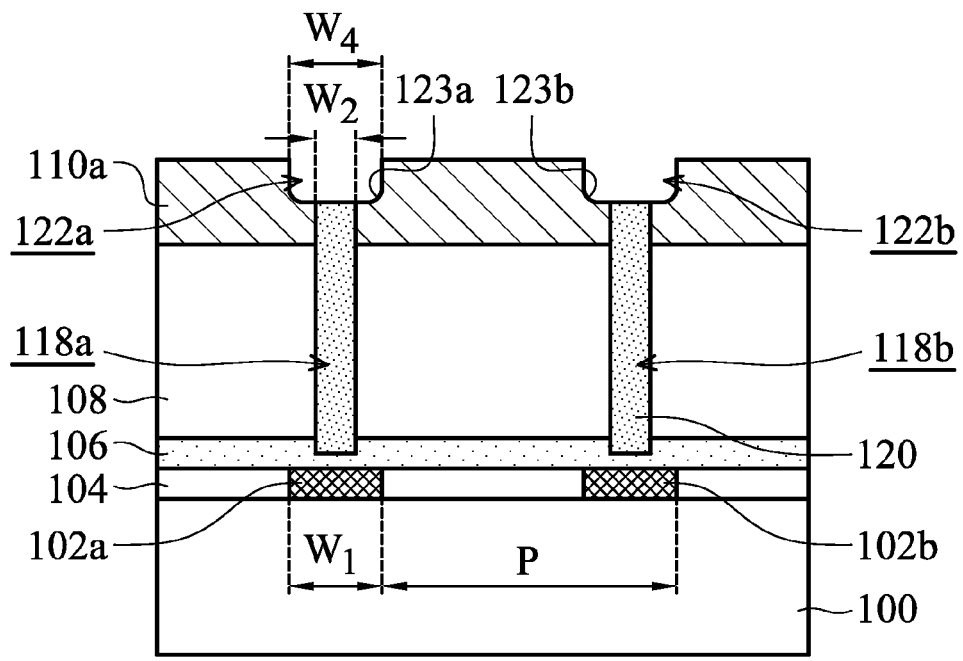
Figures 1, 1F, 2:
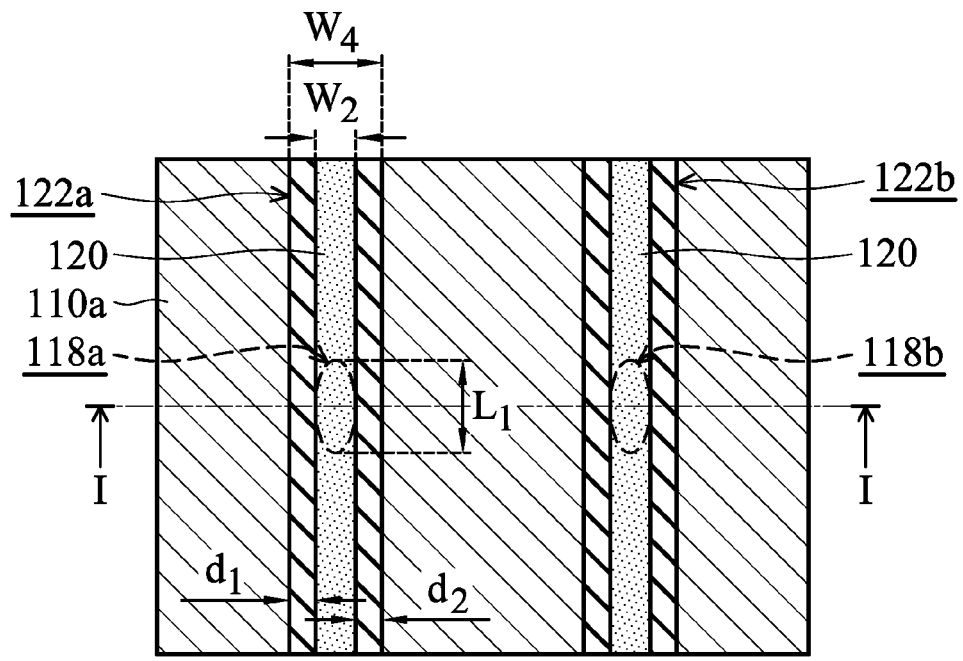

As shown in FIGS. 1F-1 and 1F-2, the hard mask 110 is partially removed to form a modified hard mask 110a, in accordance with some embodiments. The trench openings 112a and 112b are enlarged to form openings 122a and 122b. In some embodiments, an etching process is used to trim the hard mask 110 and form the modified hard mask 110a. In some embodiments, the etching process is performed without using a photoresist layer. In some embodiments, the modified hard mask 110a is formed by isotropically etching the hard mask 110. In some embodiments, an isotropic etching operation is performed to the hard mask 110 to remove a surface portion of the hard mask 110. As a result, the hard mask 110 is thinned to form the modified hard mask 110a, and the trench openings 112a and 112b are enlarged to form the openings 122a and 122b.

The trench openings 122a and 122b together form a trench pattern which will be substantially transferred to the dielectric layer 108 to form the trenches. As shown in FIGS. 1F-1 and 1F-2, each of the trench openings 122a and 122b has a width $W_4$. In some embodiments, the width $W_4$ is substantially equal to the line width $W_1$ of the conductive feature 102a or 102b. In some embodiments, the width $W_4$ is in a range from about 7 nm to about 20 nm. In some other embodiments, the width $W_4$ is greater than the line width $W_1$ of the conductive feature 102a or 102b. For example, the width $W_4$ is in a range from about 8 nm to about 22 nm.

In some embodiments, the hard mask 110 is etched in a process chamber in which the pressure is in a range from about 1.5 mTorr to about 300 mTorr. In some embodiments, a gas or a mixture of gas is used for forming a suitable etchant. The gas or mixture of gas may include $CF_4$, $CHF_3$, $CH_2F_2$, $CH_3F$, $Cl_2$, $O_2$, $N_2$, $BCl_3$, HBr, another suitable gas, or a combination thereof. In some embodiments, a top source voltage and a bias voltage are used to assist in the etching back process. The top source voltage may be in a range from about 150V to about 1500V. The bias voltage may be in a range from about 5V to about 1000V. In some other embodiments, the bias voltage is not applied.

Figures 1, 1G:
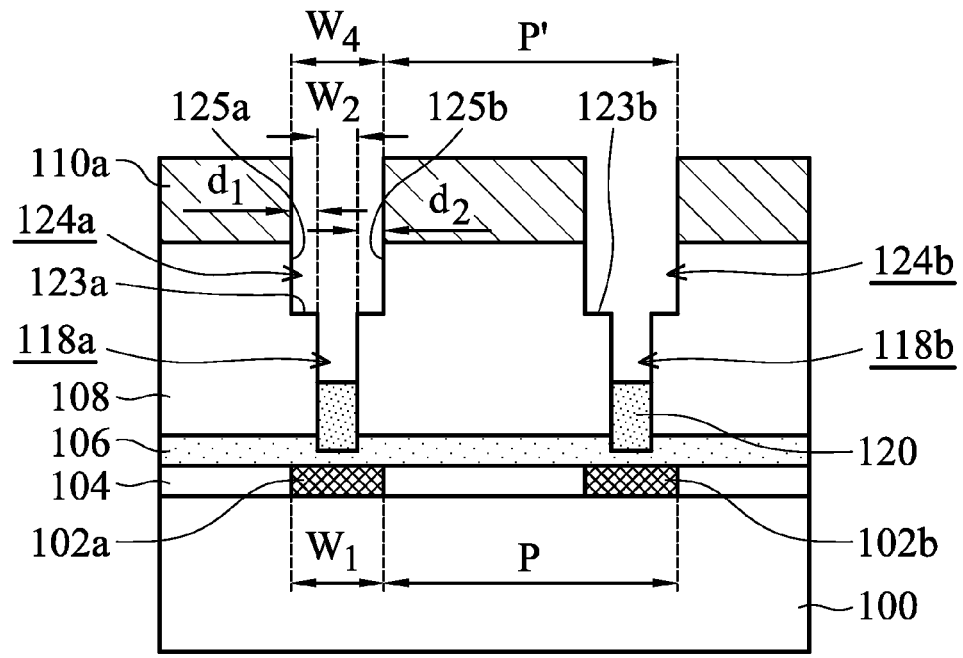
Figures 1, 1G, 2:
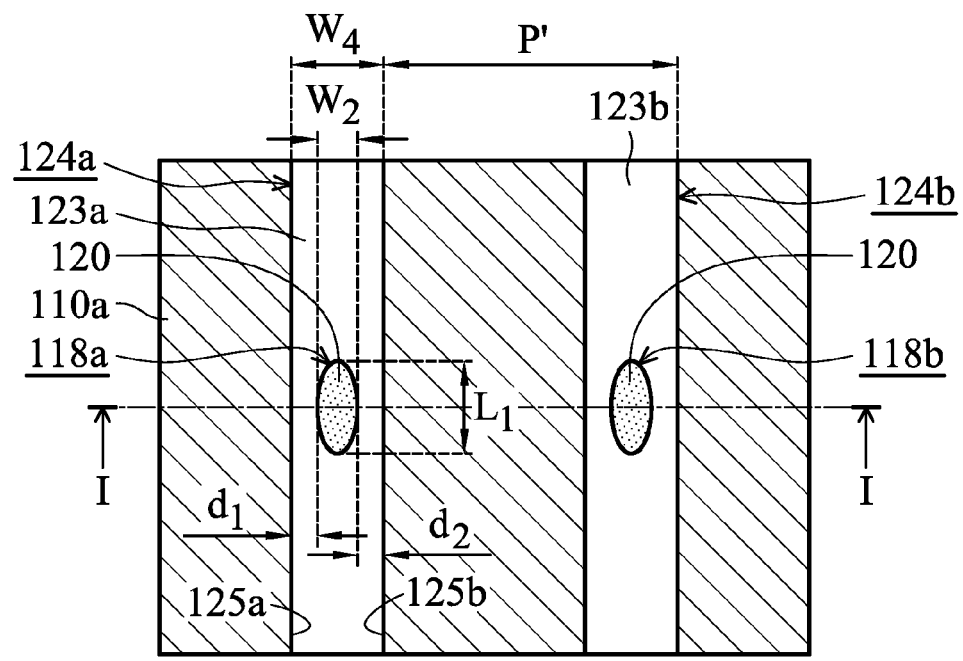

As shown in FIGS. 1G-1 and 1G-2, the dielectric layer 108 is etched through the enlarged trench openings 122a and 122b to form trenches 124a and 124b, in accordance with some embodiments. In some embodiments, each of the trenches 124a and 124b has a trench width substantially the same as the width $W_4$ of the enlarged trench openings 122a or 122b. In some embodiments, the trench width of the trench 124a or 124b is substantially equal to the line width $W_1$ of the conductive feature 102a or 102b. The trench width may be in a range from about 7 nm to about 20 nm. In some embodiments, a pitch P' between the trenches 124a and 124b is substantially equal to the pitch P between the conductive features 102a and 102b.

In some embodiments, the trenches 124a and 124b are simultaneously formed in the same process. However, embodiments of the disclosure are not limited. In some other embodiments, a double patterning process is used to form the trenches 124a and 124b. In these cases, the trenches 124a and 124b are formed sequentially in different processes.

Due to the protective layer 120, the via holes 118a and 118b are protected from being damaged during the etching process for forming the trenches 124a and 124b. Therefore, the profiles and the sizes of the via holes 118a and 118b are substantially maintained after the formation of the trenches 124a and 124b. A portion of the protective layer 120 may be left in the via holes 118a and 118b, as shown in FIGS. 1G-1 and 1G-2.

As shown in FIGS. 1G-1 and 1G-2, the trench 124a has opposite sidewalls 125a and 125b. The sidewalls 125a and 125b are laterally spaced from the via hole 118a by distances $d_1$ and $d_2$, respectively. In some embodiments, since the hard mask 110 is isotropically etched, the distance $d_1$ is substantially equal to the distance $d_2$. The via hole 118a is positioned under a middle region of the trench 124a. Similarly, the via hole 118b is positioned under a middle region of the trench 124b.

As shown in FIGS. 1G-1 and 1G-2, the trenches 124a and 124b have bottom portions 123a and 123b, respectively. The via hole 118a extends from the bottom portion 123a of the trench 124a towards the conductive feature 102a. Similarly, the via hole 118b extends from the bottom portion 123b of the trench 124b.

Figures 1, 1H:
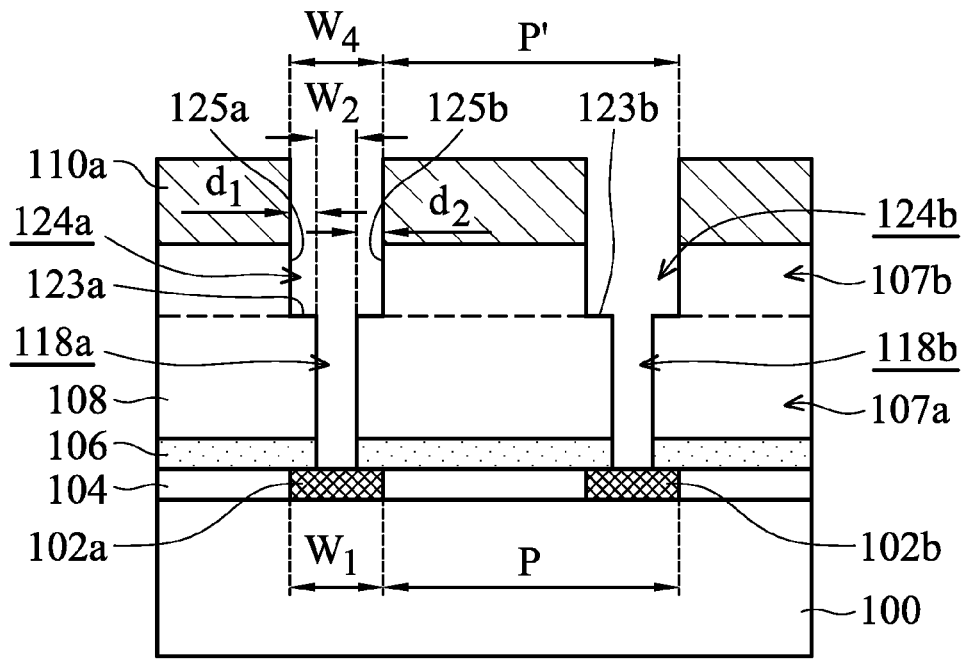
Figures 1, 1H, 2:
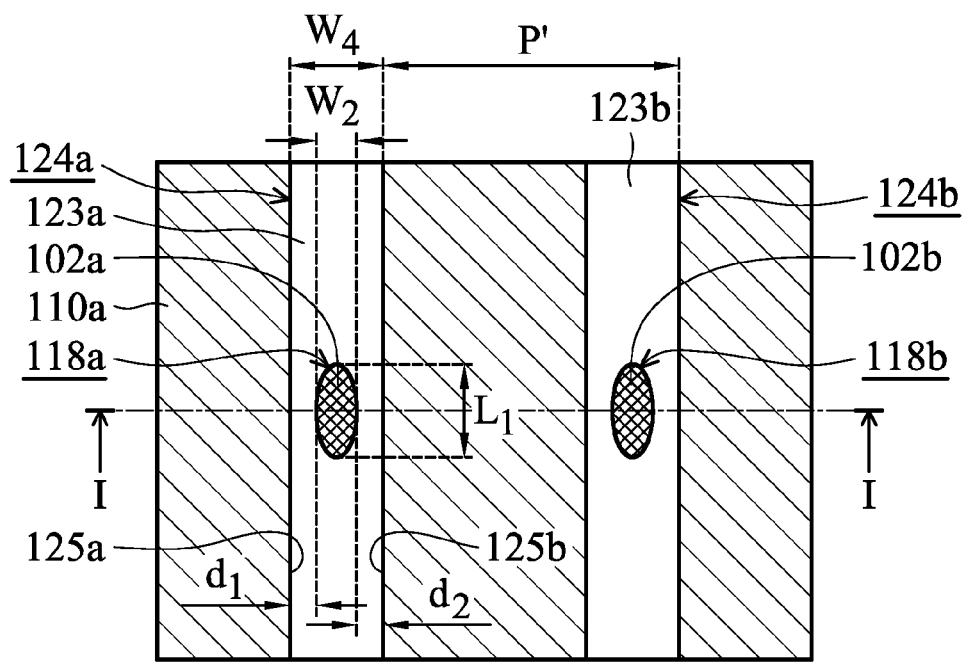

Afterwards, the protective layer 120 is removed, and the etch stop layer 106 is partially removed to expose the conductive features 102a and 102b, as shown in FIGS. 1H-1 and 1H-2 in accordance with some embodiments. In some embodiments, etching processes are performed to sequentially remove the protective layer 120 and the etch stop layer 106. Each of the etching processes may include a wet etching process, a dry etching process, another applicable process, or a combination thereof.

As shown in FIG. 1H-1, the trenches 124a and 124b and the via holes 118a and 118b are formed in a single-layered structure (i.e., the dielectric layer 108), in accordance with some embodiments. In other words, the dielectric layer 108 is a single layer. The dielectric layer 108 has a lower portion 107a, surrounding the via holes 118a and 118b, and an upper portion 107b, surrounding the trenches 124a and 124b. In some embodiments, there is no etch stop layer between the portions 107a and 107b of the dielectric layer 108. The portions 107a and 107b are portions of a single dielectric layer.

Figures 1, 1I:
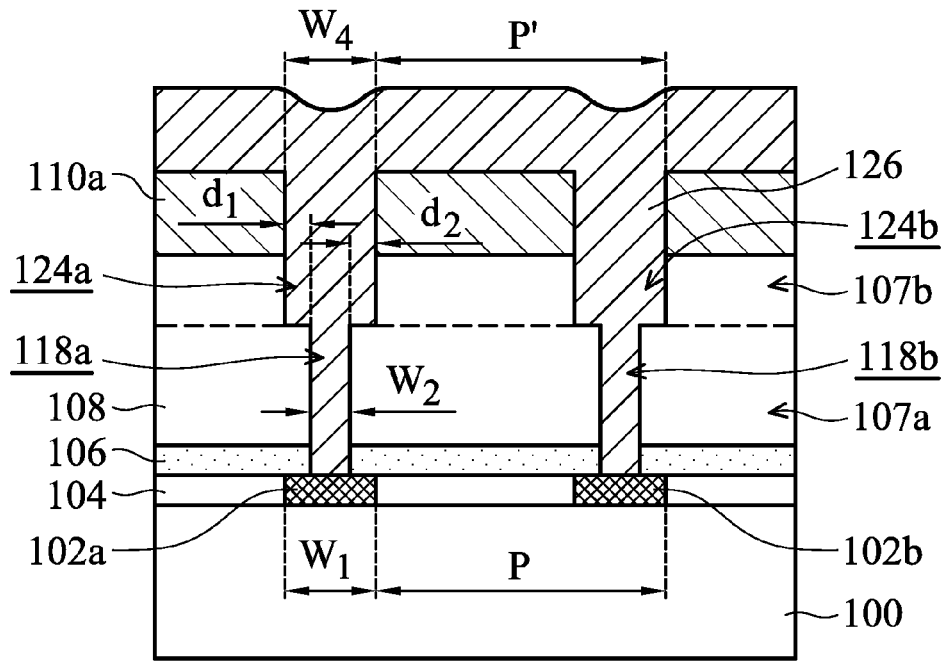
Figures 1, 1I, 2:
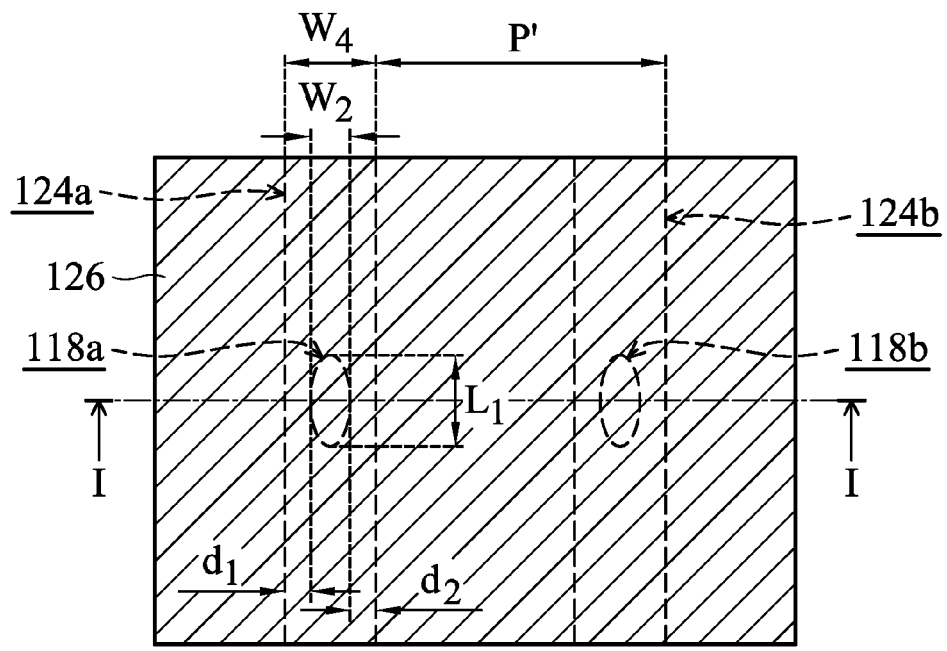
Figures 1, 1J:
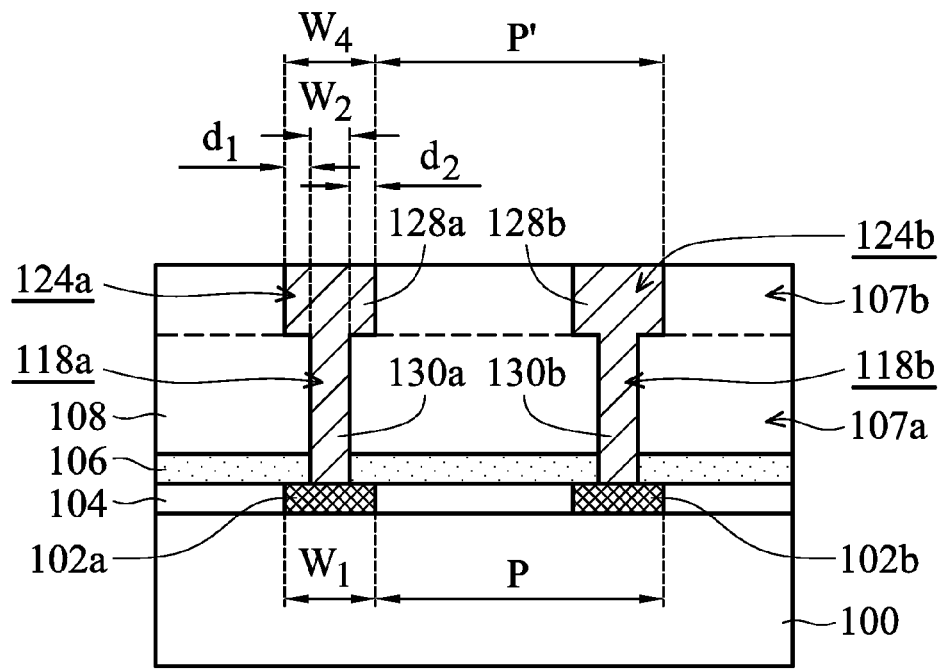
Figures 1, 1J, 2:
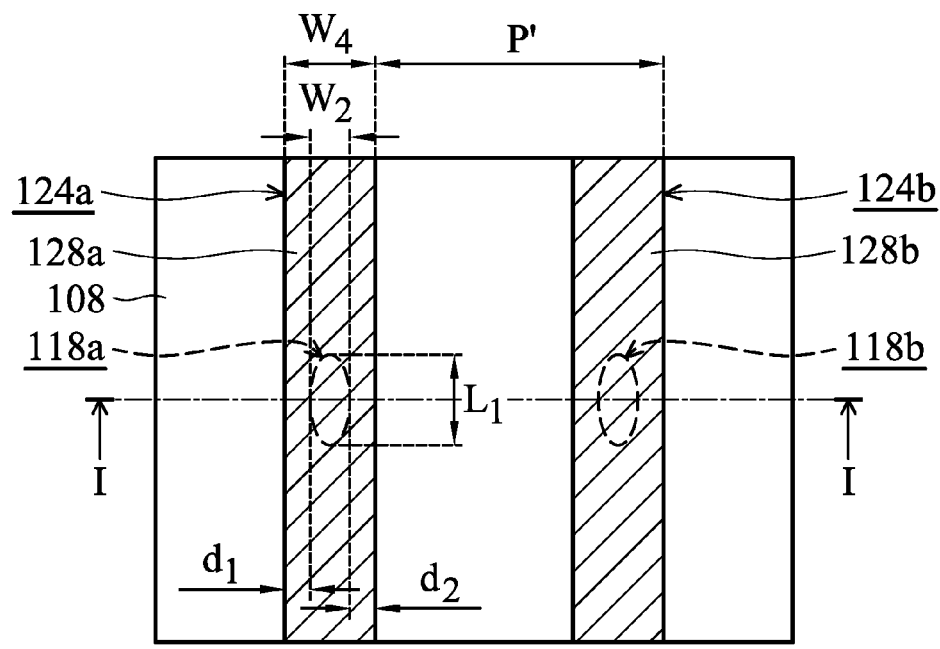
Figure 2:
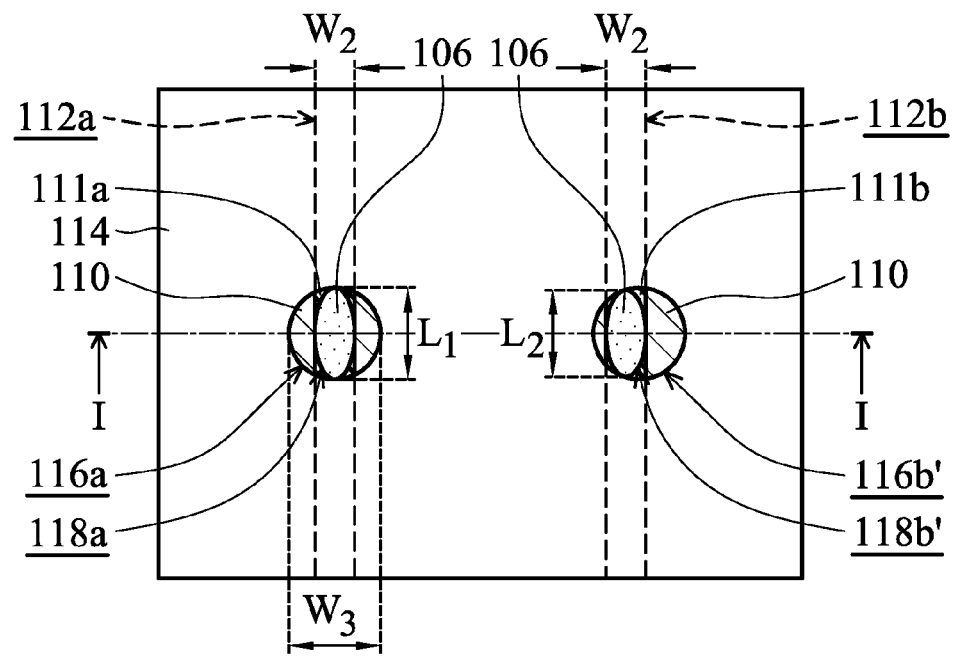

Afterwards, one or more conductive materials are deposited to fill the trenches 124a and 124b and the via holes 118a and 118b. As shown in FIG. 1I-1, a conductive layer 126 is deposited over the modified hard mask 110a to fill the trenches 124a and 124b and the via holes 118a and 118b, in accordance with some embodiments. The conductive layer 126 is made of one or more conductive materials. The conductive materials may include copper, aluminum, tungsten, titanium, nickel, gold, platinum, cobalt (Co), another suitable conductive material, or a combination thereof. In some embodiments, the conductive layer 126 is deposited using an electrochemical plating process, an electroless plating process, a PVD process, a CVD process, a spin-on process, another applicable process, or a combination thereof. The conductive layer 126 may be a single layer or have multiple stacked layers. In some embodiments, a seed layer (not shown) is used to assist in the formation of the conductive layer 126.

In some embodiments, before the conductive layer 126 is deposited, a barrier layer (not shown) is formed over the sidewalls and bottoms of the trenches 124a and 124b and the via holes 118a and 118b. For example, the barrier layer is conformally deposited in the trench openings 124a and 124b and the via holes 118a and 118b. The barrier layer is used to protect the dielectric layer 108 from diffusion of a metal material from the conductive layer 126 sequentially formed. In some embodiments, the barrier layer is made of tantalum nitride, titanium nitride, tungsten nitride, another suitable material, or a combination thereof. In some embodiments, the barrier layer is deposited using a PVD process, a CVD process, another applicable process, or a combination thereof.

As shown in FIGS. 1J-1 and 1J-2, a planarization process is performed to thin down the conductive layer 126 until the dielectric layer 108 is exposed, in accordance with some embodiments. As a result, interconnect structures (or dual damascene structures) of the semiconductor device structure are formed. The interconnect structures include conductive vias 130a and 130b and conductive lines 128a and 128b. In some embodiments, the planarization process includes a chemical mechanical polishing (CMP) process, a mechanical grinding process, an etching process, another applicable process, or a combination thereof.

Embodiments of the disclosure have many advantages. As shown in FIGS. 1J-1 and 1J-2, the conductive feature 102a is wider than the conductive via 130a. The conductive via 130a is confined by the trench opening 112a to be positioned right above the conductive feature 102a. Short circuiting issues are prevented. The conductive lines 128a and 128b and the conductive vias 130a and 130b are self-aligned with each other, respectively. Each of the conductive vias 130a and 130b is positioned under a middle region of the corresponding conductive lines 128a or 128b. The size, profile, and shape of the conductive structures formed by the conductive vias 130a and 130b and the conductive lines are substantially the same, which results in substantially the same electrical quality. It may not be necessary to form additional circuits to compensate the variations between conductive structures caused by the misalignment or shifting of patterning processes. The design window is significantly enlarged.

Figure 4:
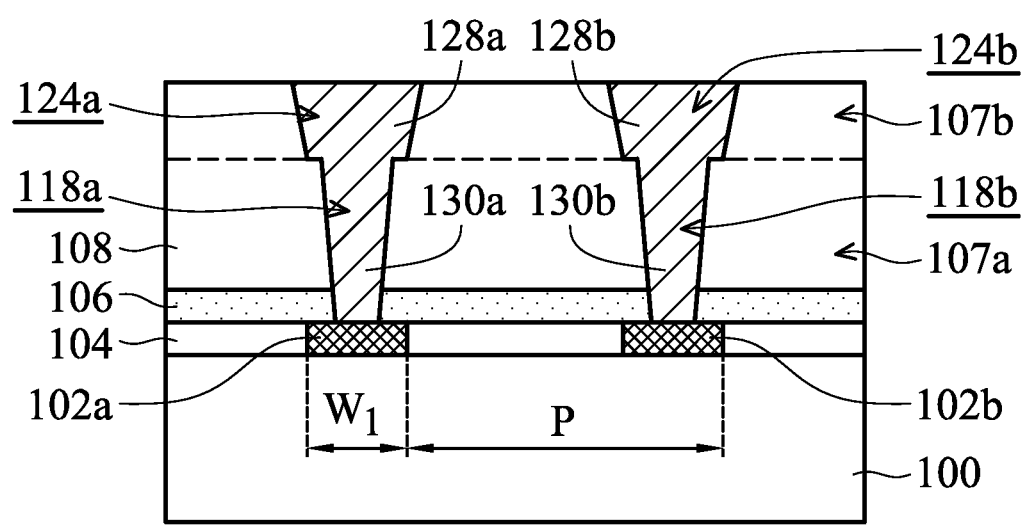
FIG. 4 is a cross-sectional view of a semiconductor device structure, in accordance with some embodiments.

Embodiments of the disclosure have many variations. FIG. 4 is a cross-sectional view of a semiconductor device structure, in accordance with some embodiments. The semiconductor device structure shown in FIG. 4 is formed by using a method that is similar to that illustrated in FIGS. 1A-1J. By fine tuning the etching condition, the sidewalls of the via holes and/or the trenches may be varied. In some embodiments, the via holes 118a and 118b have slanted sidewalls. In some embodiments, the trenches 124a and 124b have slanted sidewalls.

Figure 5A:
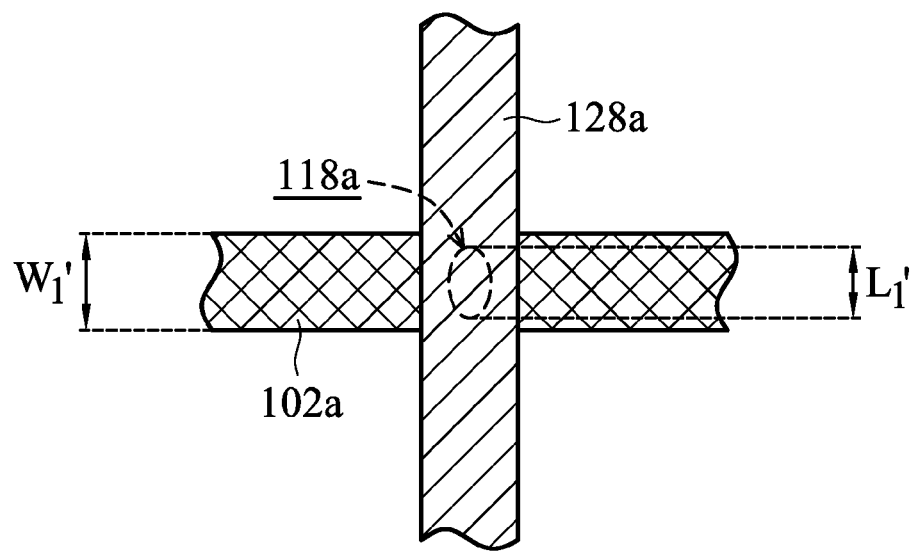
FIG. 5A is a top view of a semiconductor device structure, in accordance with some embodiments.

In some embodiments, the extending directions of the conductive line 128a and the conductive feature 102a are substantially parallel to each other, as shown in FIGS. 1J-1 and 1J-2. However, embodiments of the disclosure are not limited to the embodiments mentioned above. FIG. 5A is a top view of a semiconductor device structure, in accordance with some embodiments. The semiconductor device structure shown in FIG. 5A is formed by using a method similar to that illustrated in FIGS. 1A-1J. For clarity, the dielectric layer 108 is not shown. As shown in FIG. 5A, the extending directions of the conductive line 128a and the conductive feature 102a are not parallel to each other. In some embodiments, the extending directions of the conductive line 128a and the conductive feature 102a are substantially perpendicular to each other.

In some embodiments, the conductive line 128a is electrically connected to the conductive feature 102a through a conductive via formed in the via hole 118a between the conductive line 128a and the conductive feature 102a. In some embodiments, the via hole 118a has a substantially oval cross section taken along a plane parallel to the main surface of the semiconductor substrate 100. The via hole 118a has a long axis length $L_1'$. In some embodiments, the long axis length $L_1'$ is substantially equal to the line width $W_1'$ of the conductive feature 102a. In some other embodiments, the long axis length $L_1'$ is shorter than the line width $W_1'$ of the conductive feature 102a.

Figure 5B:
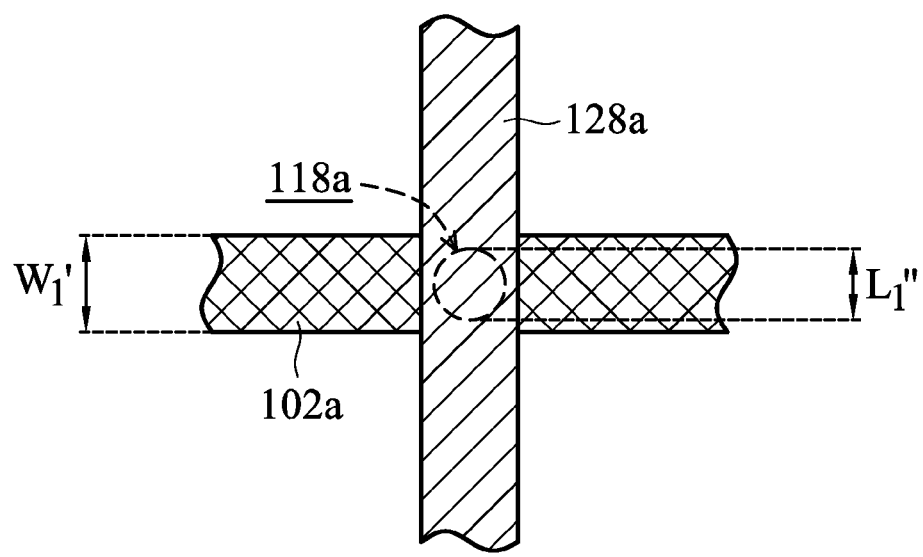
FIG. 5B is a top view of a semiconductor device structure, in accordance with some embodiments.

Embodiments of the disclosure have many variations. In some other embodiments, the via hole 118a has a substantially circular cross section taken along a plane parallel to the main surface of the semiconductor substrate 100, as shown in FIG. 5B. The via hole 118 has a width $L_1''$. In some embodiments, the width $L_1''$ is substantially equal to the line width $W_1'$ of the conductive feature 102a. In some other embodiments, the width $L_1''$ is shorter than the line width $W_1'$ of the conductive feature 102a.

Embodiments of mechanisms for forming a semiconductor device structure having dual damascene interconnect structures are provided. A hard mask with trench openings and a mask layer with hole openings are provided over a dielectric layer. Overlapping portions between the hole openings and the trench openings form a via hole pattern, which is transferred to the dielectric layer using a via etching process to form the via holes. The hard mask is further trimmed to enlarge the trench openings to form a trench pattern which is self-aligned with the via hole pattern. The trench pattern is also transferred to the dielectric layer using a trench etching process to form the trenches. The trenches and via holes are filled with a conductive material to form the dual damascene interconnect structures. Each of the dual damascene interconnect structures has substantially the same size, profile, and shapes. The performance and reliability of the semiconductor device structure are greatly improved.

In accordance with some embodiments, a semiconductor device structure is provided. The semiconductor device structure includes a semiconductor substrate and a conductive feature over the semiconductor substrate. The semiconductor device structure also includes a dielectric layer over the conductive feature and the semiconductor substrate and a via hole in the dielectric layer. The via hole has an oval cross section. The semiconductor device structure further includes a trench in the dielectric layer, and the via hole extends from a bottom portion of the trench. The trench has a trench width wider than a hole width of the via hole. In addition, the semiconductor device structure includes one or more conductive materials filling the via hole and the trench and electrically connected to the conductive feature.

In accordance with some embodiments, a semiconductor device structure is provided. The semiconductor device structure includes a semiconductor substrate and a conductive feature over the semiconductor substrate. The conductive feature has a line width. The semiconductor device structure also includes a dielectric layer over the conductive feature and the semiconductor substrate. The semiconductor device structure further includes a via hole in the dielectric layer and a trench in the dielectric layer, and the via hole extends from a bottom portion of the trench. The trench has a trench width wider than a hole width of the via hole and substantially equal to the line width. In addition, the semiconductor device structure includes one or more conductive materials filling the via hole and the trench and electrically connected to the conductive feature.

In accordance with some embodiments, a method for forming a semiconductor device structure is provided. The method includes providing a semiconductor substrate with a conductive feature formed on the semiconductor substrate. The method also includes forming a dielectric layer over the semiconductor substrate and the conductive feature. The method further includes forming a hard mask over the dielectric layer. The hard mask has a trench opening aligned with the conductive feature. In addition, the method includes forming a mask layer over the hard mask. The mask layer has a hole opening extending across the trench opening and exposing a portion of the trench opening. The method also includes etching the dielectric layer through an overlapping portion between the hole opening and the trench opening to form a via hole in the dielectric layer. The method further includes partially removing the hard mask to enlarge the trench opening and etching the dielectric layer through the enlarged trench opening to form a trench in the dielectric layer. In addition, the method includes filling one or more conductive materials in the trench and the via hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
  a conductive feature over a semiconductor substrate wherein the conductive feature has a length extending in a first direction and a width defined in a second direction, the length greater than the width, the second direction perpendicular to the first direction;
  a dielectric layer over the conductive feature and the semiconductor substrate;
  a via hole in the dielectric layer, wherein the via hole has an oval cross section in a plan view and has a first sidewall and a second sidewall in a cross-sectional view, the first and second sidewalls each being slanted from a respective first termination point to a respective second termination point, the respective first termination point being above the respective second termination point and wherein a first distance between the first termination point of the first sidewall and the first termination point of the second sidewall is greater than a second distance between the second termination point of the first sidewall and the second termination point of the second sidewall and wherein each respective second termination point interfaces the conductive feature;
  a trench in the dielectric layer, wherein the trench has a third sidewall and a fourth sidewall in the cross-sectional view, the third and fourth sidewalls each being slanted from a respective third termination point to a respective fourth termination point, wherein the respective third termination point is above the respective second termination point and a third distance between the third termination points is greater than a fourth distance between the fourth termination points, wherein the via hole extends from a bottom portion of the trench, and the trench has a trench width wider than a hole width of the via hole such that the third and fourth distances are each greater than the second distance, the third distance and the fourth distance of the trench are defined in the first direction, and the trench has a trench length, greater than the third and fourth distances, extending in the second direction; and at least one conductive material filling the via hole and the trench and electrically connected to the conductive feature.

2. The semiconductor device structure as claimed in claim 1, wherein:
the dielectric layer has an upper portion and a lower portion,
the upper portion surrounds the trench,
the lower portion surrounds the via hole, and
there is no etch stop layer between the upper portion and the lower portion.

3. The semiconductor device structure as claimed in claim 1, further comprising an etch stop layer between the semiconductor substrate and the dielectric layer.

4. The semiconductor device structure as claimed in claim 1, wherein the via hole has a slanted sidewall.

5. The semiconductor device structure as claimed in claim 1, wherein: sidewalls of the conductive feature in the cross-sectional view are substantially perpendicular to a top surface of the semiconductor substrate.

6. The semiconductor device structure as claimed in claim 1, wherein the third sidewall and the first sidewall are interposes by a fifth sidewall, the fifth sidewall extending parallel to a top surface of the semiconductor substrate, wherein the first termination point of the via hole interfaces the fifth sidewall and the fourth termination point of the trench interfaces the fifth sidewall.

7. A semiconductor device structure, comprising:
a semiconductor substrate;
a conductive feature over the semiconductor substrate, wherein the conductive feature has a line width and a line length, the line width defined in a first direction and the line length extending in a second direction perpendicular to the first direction;
a dielectric layer over the conductive feature and the semiconductor substrate;
a via hole in the dielectric layer, the via hole having slanted sidewalls terminating at the conductive feature;
a trench in the dielectric layer, wherein the via hole extends from a bottom portion of the trench, and the trench has a trench width wider than a hole width of the via hole and substantially equal to the line width, wherein the via hole has an oval shaped opening in the bottom portion of the trench; and
at least one conductive material filling the via hole and the trench and electrically connected to the conductive feature, wherein the conductive material filling the trench has the trench width defined in the second direction and a trench length extending in the first direction.

8. The semiconductor device structure as claimed in claim 7, wherein:
the trench has a first sidewall and a second sidewall opposite to the first sidewall,
the first sidewall is laterally spaced from the via hole by a first distance, and
the second sidewall is laterally spaced from the via hole by a second distance, and wherein the first and second sidewalls are slanted from a first end point to a second end point of the respective first and second sidewall.

9. The semiconductor device structure as claimed in claim 8, wherein the first distance is substantially equal to the second distance.

10. The semiconductor device structure as claimed in claim 8, wherein the trench width is in a range from about 7 nm to about 20 nm.

11. The semiconductor device structure as claimed in claim 7, wherein:
the dielectric layer has an upper portion and a lower portion,
the upper portion surrounds the trench,
the lower portion surrounds the via hole, and
there is no etch stop layer between the upper portion and the lower portion.

12. The semiconductor device structure as claimed in claim 11, wherein the upper portion is in direct contact with the lower portion.

13. The semiconductor device structure as claimed in claim 11, wherein the upper portion is thinner than the lower portion.

14. The semiconductor device structure of claim 7, wherein a longitudinal axis of the via hole is perpendicular to a longitudinal axis of the conductive feature in a plan view.

15. A semiconductor device structure comprising:
a conductive feature over a semiconductor substrate;
a dielectric layer over the conductive feature and the semiconductor substrate;
a via hole in the dielectric layer, wherein the via hole has an oval cross section in a plan view and has a first sidewall and a second sidewall in a cross-sectional view, the first and second sidewalls each being slanted from a respective first termination point to a respective second termination point, the respective first termination point being above the respective second termination point and wherein a first distance between the first termination point of the first sidewall and the first termination point of the second sidewall is greater than a second distance between the second termination point of the first sidewall and the second termination point of the second sidewall and wherein each respective second termination point interfaces the conductive feature;
a trench in the dielectric layer, wherein the trench has a third sidewall and a fourth sidewall in the cross-sectional view, the third and fourth sidewalls each being slanted from a respective third termination point to a respective fourth termination point, wherein the respective third termination point is above the respective second termination point and a third distance between the third termination points is greater than a fourth distance between the fourth termination points, wherein the via hole extends from a bottom portion of the trench, and the trench has a trench width wider than a hole width of the via hole such that the third and fourth distances are each greater than the second distance; and
at least one conductive material filling the via hole and the trench and electrically connected to the conductive feature, wherein extending directions of the conductive material filling the trench and the conductive feature are not parallel to each other and wherein the via hole has a long axis length, and the long axis length is shorter than a line width of the conductive feature.

16. The semiconductor device structure as claimed in claim 15, wherein:
the dielectric layer has an upper portion and a lower portion,
the upper portion surrounds the trench,
the lower portion surrounds the via hole, and
there is no etch stop layer between the upper portion and the lower portion.

17. The semiconductor device structure as claimed in claim 15, wherein:

the dielectric layer has an upper portion and a lower portion, the upper portion surrounds the trench, the lower portion surrounds the via hole.

18. The semiconductor device structure as claimed in claim 17, further comprising an etch stop layer between the semiconductor substrate and the dielectric layer.

19. The semiconductor device structure as claimed in claim 15, wherein the at least one conductive material is copper.

20. The semiconductor device structure as claimed in claim 15, wherein: sidewalls of the conductive feature in the cross-sectional view are substantially perpendicular to a top surface of the semiconductor substrate.

* * * * *